United States Patent
Wu

(10) Patent No.: US 11,532,646 B2
(45) Date of Patent: Dec. 20, 2022

(54) DISPLAY PANEL, DISPLAY DEVICE, AND DISPLAY SYSTEM

(71) Applicant: Shenzhen China Star Optoelectronics Semiconductor Display Technology Co., Ltd., Guangdong (CN)

(72) Inventor: Ruixi Wu, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 80 days.

(21) Appl. No.: 17/049,350

(22) PCT Filed: Sep. 4, 2020

(86) PCT No.: PCT/CN2020/113366
§ 371 (c)(1),
(2) Date: Oct. 21, 2020

(87) PCT Pub. No.: WO2022/027759
PCT Pub. Date: Feb. 10, 2022

(65) Prior Publication Data
US 2022/0045104 A1      Feb. 10, 2022

(30) Foreign Application Priority Data
Aug. 5, 2020   (CN) .......................... 202010777670.X

(51) Int. Cl.
*H01L 27/12*    (2006.01)
(52) U.S. Cl.
CPC ................................. *H01L 27/124* (2013.01)

(58) Field of Classification Search
CPC ........................ H01L 27/124; G02F 1/136286
See application file for complete search history.

(56) References Cited

U.S. PATENT DOCUMENTS

| | | | |
|---|---|---|---|
| 2001/0002146 A1* | 5/2001 | Komatsu | G02F 1/134363 349/141 |
| 2005/0184392 A1* | 8/2005 | Chen | H01L 21/76802 438/622 |
| 2010/0156854 A1* | 6/2010 | Fisher | G06F 3/1446 345/204 |
| 2012/0223440 A1 | 9/2012 | Fujita | |

FOREIGN PATENT DOCUMENTS

| | | |
|---|---|---|
| CN | 101847628 | 9/2010 |
| CN | 103149713 | 6/2013 |
| CN | 104133333 | 11/2014 |

(Continued)

*Primary Examiner* — Peter M Albrecht

(57) ABSTRACT

A display panel, a display device, and a display system are provided. The display panel includes a plurality of conductive portions. Each of the conductive portions is respectively disposed between corresponding metal layers to be electrically connected in the display panel, and is used to electrically connect with the metal layers to be electrically connected. At least two conductive portions are provided between any two of the metal layers to be electrically connected. The at least two conductive portions are used for an electrical connection to realize multi-point connection of different metal layers, which improves a reliability in a conversion of different metal layers.

3 Claims, 2 Drawing Sheets

(56) References Cited

FOREIGN PATENT DOCUMENTS

| | | | | | |
|---|---|---|---|---|---|
| CN | 105609508 | A | * | 5/2016 | ........... H01L 27/124 |
| CN | 108535928 | | | 9/2018 | |
| CN | 109037235 | A | * | 12/2018 | ........... H01L 27/124 |
| CN | 109461403 | | | 3/2019 | |
| JP | 2009-267053 | | | 11/2009 | |

* cited by examiner

DISPLAY PANEL, DISPLAY DEVICE, AND DISPLAY SYSTEM

RELATED APPLICATIONS

This application is a National Phase of PCT Patent Application No. PCT/CN2020/113366 having International filing date of Sep. 4, 2020, which claims the benefit of priority of Chinese Patent Application No. 202010777670.X filed on Aug. 5, 2020. The contents of the above applications are all incorporated by reference as if fully set forth herein in their entirety.

FIELD AND BACKGROUND OF THE INVENTION

The present invention relates to the field of display technologies, and in particular to a display panel, a display device, and a display system.

Thin film transistor (TFT) substrates are array side substrates that can control deflections of liquid crystals in TFT-LCD (thin film transistor liquid crystal display) products, thereby affecting screen displays. However, before the TFT substrates and color filter (CF) substrates are combined, a comprehensive testing for electrical performance is required. In comprehensive testing processes, in-plane circuits need to be connected to buses, and shorting bars are used for power-on control. There are many lines in Fanout (metal sector) areas outside AA (active area) areas, and there are also more intersections. In order to prevent metal lines in same layers from crossing and shorting, different metal conductive layers need to be switched.

A conversion between different layers of metal lines is mainly by etching non-metal layers to leak out holes, and then use conductive films to fill the holes to connect different layers of metal. However, conductive layers are thinner, and it is most likely to be burned by currents when main circuits are energized. Therefore, in an implementation process, inventors found that at least following problems exist in traditional technologies: Connections between different metal layers of traditional display panels are easy to burn, which causes the display panels to fail.

SUMMARY OF THE INVENTION

Based on this, it is necessary to provide a display panel, a display device, and a display system for a problem that connections between different metal layers of traditional display panels are easy to burn, which causes the display panels to fail.

In order to achieve the foregoing objective, on one hand, an embodiment of the present invention provides a display panel comprising a plurality of conductive portions;

wherein each of the conductive portions is respectively disposed between corresponding metal layers to be electrically connected in the display panel, and is used to electrically connect with the metal layers to be electrically connected; and at least two conductive portions provided between any two of the metal layers to be electrically connected, and the conductive portions between any two of the metal layers to be electrically connected are spaced apart from each other.

On another hand, an embodiment of the present invention further provides a display device comprising a display panel. The display panel comprises a plurality of conductive portions;

wherein each of the conductive portions is respectively disposed between corresponding metal layers to be electrically connected in the display panel, and is used to electrically connect with the metal layers to be electrically connected; and at least two conductive portions provided between any two of the metal layers to be electrically connected, and the conductive portions between any two of the metal layers to be electrically connected are spaced apart from each other.

On the other hand, an embodiment of the present invention further provides a display system, comprising a processing device and the above-mentioned display device, wherein the processing device is connected to the display device.

Display panels provided by each embodiment of the present invention comprise a plurality of conductive portions. Each of the conductive portions is respectively disposed between corresponding metal layers to be electrically connected in the display panel and is used to electrically connect with the metal layers to be electrically connected. At least two conductive portions are provided between any two of the metal layers to be electrically connected. In the present invention, when different metal layers are converted, at least two conductive portions are used for an electrical connection, so as to realize multi-point connection of different metal layers and improve a reliability of conversions of the different metal layers. Even if one conductive portion is burned out, there are other conductive portions to ensure the electrical connection between different metal layers to avoid display panel failure.

DESCRIPTION OF SPECIFIC EMBODIMENTS OF THE INVENTION

In order to facilitate understanding of the present invention, a fuller description of the present invention is provided below with reference to the accompanying diagram. Preferred embodiments of the present invention are given in the accompanying drawings. However, the present invention may be implemented in many different forms and is not limited to the embodiments described herein. Rather, these embodiments are provided to make the disclosure of the present invention more thorough and comprehensive.

It should be noted that when a component is considered to be "connected" to another component, it can either be directly connected to and integrated with another component, or it can be centered at the same time. The term "sandwich" and similar expressions are used herein for illustrative purposes only.

Unless otherwise defined, all technical and scientific terms used herein have the same meaning as commonly understood by those skilled in the technical field of the present invention. The terms used in the specification of the present invention herein is only for the purpose of describing specific embodiments and is not intended to limit the application. The term "and/or" as used herein includes any and all combinations of one or more related listed items.

Figure 1:
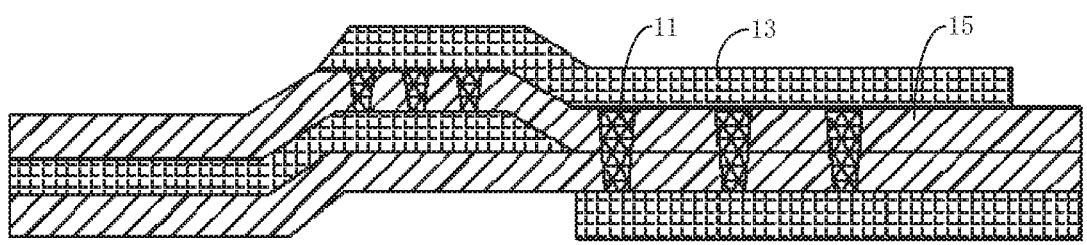
FIG. 1 is a schematic structural view of a display panel in an embodiment.
Figure 2:
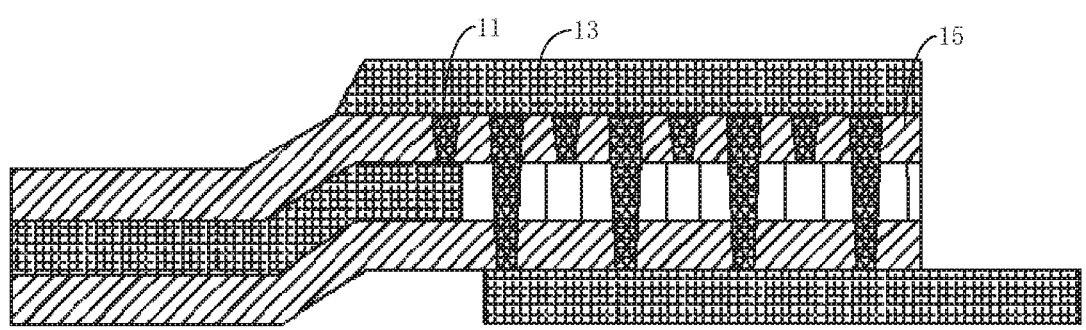
FIG. 2 is a schematic structural view of the display panel in another embodiment.

In order to solve a problem that connections between different metal layers of traditional display panels are easy to burn, which causes display panels to fail, in an embodiment, as shown in FIG. 1 and FIG. 2, a display panel is provided, which comprises a plurality of conductive portions 11.

Each of the conductive portions 11 is respectively disposed between corresponding metal layers 13 to be electrically connected in the display panel, and is used to electrically connect with the metal layers 13 to be electrically connected.

At least two conductive portions 11 are provided between any two of the metal layers 13 to be electrically connected, and the conductive portions 11 between any two of the metal layers 13 to be electrically connected are spaced apart from each other.

It should be noted that the conductive portions are connected between two different metal layers to be electrically connected in the display panel, and are used to electrically connect with two different metal layers to be electrically connected. The metal layer to be electrically connected comprises a gate metal layer, a source-drain metal layer, and a pixel electrode metal layer.

The number of the conductive portions is determined according to actual needs. However, at least two conductive portions must be provided between the two metal layers to be electrically connected, so that when one of them is damaged, the other can still ensure an electrical connection between the metal layers. The more the number of the conductive portions between the two metal layers to be electrically connected, the higher the reliability of the electrical connection of the metal layers. However, a specific number of the conductive portions is restricted by a size of the metal layer, and the number of the conductive portions can be determined according to the size of the metal layer.

The conductive portion is used for conducting electricity, and the conductive portion is made of conductive material. In an example, the conductive portion is a conductive film. For example, a via hole is made on the non-conductive layer between two metal layers, and the conductive film is inserted through the via hole to connect the two metal layers of the via hole. Further, in an example, the conductive film is a metal conductive film, an oxide conductive film, a compound conductive film, a polymer conductive film, or a composite conductive film.

According to a structure of the display panel, there may be different arrangements for the conductive portion. In an example, as shown in FIG. 1, when the metal layers 13 to be electrically connected are adjacent metal layers, the conductive portion 11 passes through the non-conductive layer 15 between the metal layers 13 to be electrically connected. In the example, the electrical connection is between two immediately adjacent metal layers. The non-conductive layer between the two immediately adjacent metal layers may be a gate insulating layer, a passivation layer, or both the gate insulating layer and the passivation layer. In order to connect the two adjacent metal layers, an etching process is used to form the via hole on the non-conductive layer, and then the conductive portion is formed in the via hole, thereby conducting the two adjacent metal layers.

In an example, as shown in FIG. 2, at least one intermediate metal layer is sandwiched between the metal layers to be electrically connected. The conductive portion passes through the non-conductive layer between the metal layers to be electrically connected and the intermediate metal layer, and there is no connection between the conductive portion and the intermediate metal layer. In the example, there is another metal layer (intermediate metal layer) between the metal layers to be electrically connected, and the metal layer to be electrically connected needs to be electrically connected across the intermediate metal layer. An etching process is used to form the via hole on the non-conductive layer and the intermediate metal layer, and then the conductive portion is formed in the via hole, thereby conducting the metal layer to be electrically connected. The conductive portion is not conducting with the metal layer. In an example, a non-conductive film needs to be plated on a sidewall of the via hole of the intermediate metal layer, and then the conductive portion is formed. The non-conductive layer comprises a gate insulating layer and a passivation layer.

The conductive portion can also be all disposed in an AA (active area) area, or all disposed in a Fanout (metal sector) area around the AA area, and can also disposed partly in the AA area and partly in the Fanout area. The specific setting method can be determined according to actual needs. In a preferred example, since there are many metal lines in the Fanout area in traditional technologies, there are also many intersections of metal lines, and the lines are prone to cross-circuiting. In order to prevent cross-circuits on the metal lines on the same metal layer in the Fanout area, it is necessary to convert the different metal layers. All the conductive portions are disposed in the Fanout area, and any two of the metal layers to be electrically connected comprise two conductive portions.

The display panel provided by each embodiment of the present invention comprises the plurality of conductive portions. Each of the conductive portions is respectively disposed between the corresponding metal layers to be electrically connected in the display panel and is used to electrically connect with the metal layers to be electrically connected. The at least two conductive portions are provided between any two of the metal layers to be electrically connected. In the present invention, when different metal layers are converted, at least two conductive portions are used for the electrical connection, so as to realize multi-point connection of different metal layers and improve a reliability of conversions of the different metal layers. Even if one conductive portion is burned out, there are other conductive portions to ensure the electrical connection between different metal layers to avoid display panel failure.

In an embodiment, a display device is provided, which comprising the above-mentioned display panel.

It should be noted that the display panel comprises the plurality of conductive portions. Each of the conductive portions is respectively disposed between the corresponding metal layers to be electrically connected in the display panel and is used to electrically connect with the metal layers to be electrically connected. The at least two conductive portions are provided between any two of the metal layers to be electrically connected.

Specifically, the conductive portions are connected between two different metal layers to be electrically connected in the display panel, and are used to electrically connect with two different metal layers to be electrically connected. The metal layer to be electrically connected comprises the gate metal layer, the source-drain metal layer, and the pixel electrode metal layer.

The number of the conductive portions is determined according to the actual needs. However, the at least two conductive portions must be provided between the two metal layers to be electrically connected, so that when one of them is damaged, the other can still ensure the electrical connection between the metal layers. The more the number of the conductive portions between the two metal layers to be electrically connected, the higher the reliability of the electrical connection of the metal layers. However, the specific number of the conductive portions is restricted by the size of the metal layer, and the number of the conductive portions can be determined according to the size of the metal layer.

The conductive portion is used for conducting electricity, and the conductive portion is made of conductive material. In an example, the conductive portion is the conductive film. For example, the via hole is made on the non-conductive layer between two metal layers, and the conductive film is inserted through the via hole to connect the two metal layers of the via hole. Further, in an example, the conductive film is the metal conductive film, the oxide conductive film, the compound conductive film, the polymer conductive film, or the composite conductive film.

According to the structure of the display panel, there may be different arrangements for the conductive portion. In an example, as shown in FIG. 1, when the metal layers to be electrically connected are adjacent metal layers, the conductive portion passes through the non-conductive layer between the metal layers to be electrically connected. In the example, the electrical connection is between two immediately adjacent metal layers. The non-conductive layer between the two immediately adjacent metal layers may be the gate insulating layer, the passivation layer, or both the gate insulating layer and the passivation layer. In order to connect the two adjacent metal layers, the etching process is used to form the via hole on the non-conductive layer, and then the conductive portion is formed in the via hole, thereby conducting the two adjacent metal layers.

In an example, as shown in FIG. 2, at least one intermediate metal layer is sandwiched between the metal layers to be electrically connected. The conductive portion passes through the non-conductive layer between the metal layers to be electrically connected and the intermediate metal layer, and there is no connection between the conductive portion and the intermediate metal layer. In the example, there is another metal layer (intermediate metal layer) between the metal layers to be electrically connected, and the metal layer to be electrically connected needs to be electrically connected across the intermediate metal layer. The etching process is used to form the via hole on the non-conductive layer and the intermediate metal layer, and then the conductive portion is formed in the via hole, thereby conducting the metal layer to be electrically connected. The conductive portion is not conducting with the metal layer. In an example, the non-conductive film needs to be plated on a sidewall of the via hole of the intermediate metal layer, and then the conductive portion is formed. The non-conductive layer comprises the gate insulating layer and the passivation layer.

In each embodiment of the display device of the present invention, the metal layer in the display panel of the display device uses multi-point connection, which improves the reliability of the electrical connection, thereby improving the reliability of the display device and prolonging life of the display device.

In an example, a display system is also provided, which comprises a processing device and the display device described in the embodiments of the display device of the present invention, wherein the processing device is connected to the display device.

It should be noted that the display device in the embodiment is the same as the display device described in each embodiment of the display device of the present invention. For detailed description, please refer to the description of each embodiment of the display device of the present invention, which will not be repeated here.

Technical features of the above-mentioned embodiments can be combined arbitrarily. In order to make the description concise, all possible combinations of the various technical features in the above embodiments are not described. However, as long as there is no contradiction in the combination of these technical features, it should be regarded as the scope of the specification.

The above-mentioned embodiments only express several implementation modes of the present invention, and their description is more specific and detailed, but they should not be interpreted as a limitation on the scope of the claims. It should be noted that for those of ordinary skill in the art, without departing from the concept of the present invention, several modifications and improvements can be made, which all belong to the scope of protection of the present invention. Therefore, the scope of protection of the patent in the present invention shall be subject to the claims.

What is claimed is:

1. A display device, comprising:
a display panel;
wherein the display panel comprises a plurality of conductive portions;
wherein each of the plurality of conductive portions is respectively disposed between corresponding metal layers to be electrically connected in the display panel, and is used to electrically connect with the metal layers to be electrically connected;
wherein at least two of the plurality of conductive portions are provided between any two of the metal layers to be electrically connected, and the conductive portions between any two of the metal layers to be electrically connected are spaced apart from each other;
wherein at least one intermediate metal layer is sandwiched between the metal layers to be electrically connected, each of the plurality of conductive portions passes through a non-conductive layer between the metal layers to be electrically connected and the at least one intermediate metal layer, and each of the plurality of conductive portions and the at least one intermediate metal layer are not electrically connected; and
wherein the non-conductive layer comprises a gate insulating layer and a passivation layer.

2. The display device as claimed in claim 1, wherein the plurality of conductive portions are conductive films.

3. The display device as claimed in claim 2, wherein the conductive film is a metal conductive film, an oxide conductive film, a compound conductive film, a polymer conductive film or a composite conductive film.

* * * * *